United States Patent
Keasler, Jr.

(10) Patent No.: US 6,741,196 B2
(45) Date of Patent: May 25, 2004

(54) METHOD AND APPARATUS FOR A HIGH-DRIVE CURRENT DIGITAL-TO-ANALOG CONVERTER

(75) Inventor: William Edward Keasler, Jr., Tinton Falls, NJ (US)

(73) Assignee: Globespan Virata Incorporated, Red Bank, NJ (US)

( * ) Notice: Subject to any disclaimer, the term of this patent is extended or adjusted under 35 U.S.C. 154(b) by 0 days.

(21) Appl. No.: 10/336,922

(22) Filed: Jan. 6, 2003

(65) Prior Publication Data
US 2003/0128144 A1 Jul. 10, 2003

Related U.S. Application Data
(60) Provisional application No. 60/345,832, filed on Jan. 4, 2002.

(51) Int. Cl.$^7$ .................................................. H03M 3/00
(52) U.S. Cl. ...................................... 341/143; 341/144
(58) Field of Search ................................... 341/143, 144

(56) References Cited

U.S. PATENT DOCUMENTS 5,198,782 A * 3/1993 Scott ........................... 330/277
5,258,758 A * 11/1993 Sooch .......................... 341/144
6,163,286 A * 12/2000 Lee et al. ..................... 341/143

* cited by examiner

*Primary Examiner*—Peguy JeanPierre
(74) *Attorney, Agent, or Firm*—Hunton & Williams LLP

(57) ABSTRACT

The invention is a method and apparatus for a digital DSL line driver that comprise a multi stage delta-sigma modulator with a high current 1-bit digital-to-analog converter (DAC) output stage. By adding the high current drive capability to the 1-bit DAC in a delta-sigma digital-to-analog converter the traditional DSL line driver used in digital subscriber lines applications is made less complex and it saves on the overall power consumption. The invention uses a transistor switch arrangement to save the overall power by alternately switching "ON" some the transistors while having other transistor turned "OFF".

27 Claims, 5 Drawing Sheets

METHOD AND APPARATUS FOR A HIGH-DRIVE CURRENT DIGITAL-TO-ANALOG CONVERTER

CROSS REFERENCE TO RELATED APPLICATIONS

Priority is claimed based on U.S. Provisional Application No. 60/345,832 entitled "High-Drive-Current Digital-to-Analog Converter" filed Jan. 4, 2002.

FIELD OF THE INVENTION

The present invention relates to a method and apparatus for reducing power and complexity in a digital subscriber line (DSL) driver with a multi stage delta-sigma modulator with a high current 1-bit digital-to-analog converter (DAC) output stage.

BACKGROUND OF THE INVENTION

With the advent of the internet and other high-bandwidth electronic communication systems and the consumer demand for information, interactive gaming and electronic entertainment such as video on-demand, there has been a substantial need for reliable and affordable high bandwidth mediums for facilitating data transmissions between service providers and their customers. Attempts to ensure that such mediums be affordable to consumers, and structurally attainable in a cost-effective manner for providing service to customers, involve using already existing copper wire telephone systems (plain old telephone system or POTS) infrastructure.

There are many ways to bring home a high-speed link beyond the 56-kbps limit that POTS-based V.90 performance allows. The methods include integrated-services digital network (ISDN), satellite links, cable modems, hybrid fiber-coax, and wireless local loops. All these methods eventually encounter the virtually universal, metallic local loop that is the "last mile" between the phone company's central office (CO) and the end user in the public switched-telephone network (PSTN). This loop can be a significant barrier to installing yet another type of path.

Digital subscriber line (xDSL) holds a lot of promise. It uses advanced signal-processing concepts that force mathematician Claude Shannon's 1948 theory of channel-information capacity to its ultimate level, pushing data onto the local loop at several-megabit-per-second rates. But making xDSL a reality takes more than sophisticated algorithms running on digital signal processors (DSPs). An analog-front-end (AFE) circuitry that sits between the telephone company loop and the DSP plays a key role in successful and practical implementation of any xDSL variation. This AFE must digitize or re-create analog signals with excellent dynamic-range performance, drive fast-slewing signals into lossy copper lines, and capture the weak incoming analog signals that far stronger outbound signals overshadow—all the while using little power at each end of the link. A number of DSL standards and protocols have been proposed such as VDSL, SHDSL, RADSL and ADSL.

In existing systems, the CO receives digital information from a data source and sends information to an AFE that converts the data from a digital form into a continuous time analog signal that can be transmitted on the analog lines. The analog signal is delivered, via a DSL line driver, which is separate from the AFE, in accordance with the amount of power required to drive the amplified analog signal through the two-wire pair to the end-user. There is always a need to minimize the power required to transmit and receive data at a higher speed and because the existing DSL line drivers use a high-current, linear Class AB or Class G amplifier arrangements with a continuous time (analog) waveform, arrangements where the DSL line driver input is produced by filtering the input of a digital-to-analog converter. Such linear Class AB line drivers account for 50%–75% of the per-port power consumption and in the Class G line driver scenario, an incremental improvement in the power consumed is achieved at the cost of additional power supply rails. These and other drawbacks exist.

SUMMARY OF THE INVENTION

In light of the foregoing, the invention is a method and apparatus for a high-drive current digital-to-analog converter that accommodates all DSL applications in a power efficient manner, by adding a high-current drive capability to the 1-bit digital-to-analog converter based on a delta-sigma modulator.

In general, one embodiment of the invention provides a digital sequence x(n), clocked at an input sampling rate, and applied to an interpolator, where it is sampled at a higher rate. The sequence may then be applied into a multi-stage delta-sigma ($\Delta\Sigma$) modulator where the sequence is once again sampled at a higher sampling rate of the input sampling rate. The multi-stage delta-sigma modulator produces a bi-level output of the sequence which includes output noise that has been spectrally shaped to insure that the noise power is small in the band of frequencies occupied by the desired signal.

The invention has numerous advantageous features, a few examples of which are delineated hereafter. Embodiments of the invention, which are described herein, may possess one or more, but not necessarily all, of the features set out hereafter. One feature of the invention is that it provides a low cost solution to providing a line driver, which will function on all DSL applications.

Another feature is that, while it provides a simpler line DSL driver with less components for use in all DSL applications, it reduces the amount of power needed for a conventional DSL line driver.

Other objects, features, and advantages of the present invention will become apparent to one of ordinary skill in the art upon examination of the following drawings and detailed description. It is intended that all such additional objects, features, and advantages be included herein within the scope of the present invention, as defined by the claims.

BRIEF DESCRIPTION OF THE DRAWINGS

The present invention can be understood more completely by reading the following Detailed Description of the Invention, in conjunction with the accompanying drawings, in which.

DETAILED DESCRIPTION OF THE INVENTION

The following description is intended to convey a thorough understanding of the invention by providing a number of specific embodiments and details involving an effective method and apparatus of removing inter-symbol interference from a received signal. It is understood, however, that the invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending upon specific design and other needs.

Figure 1:
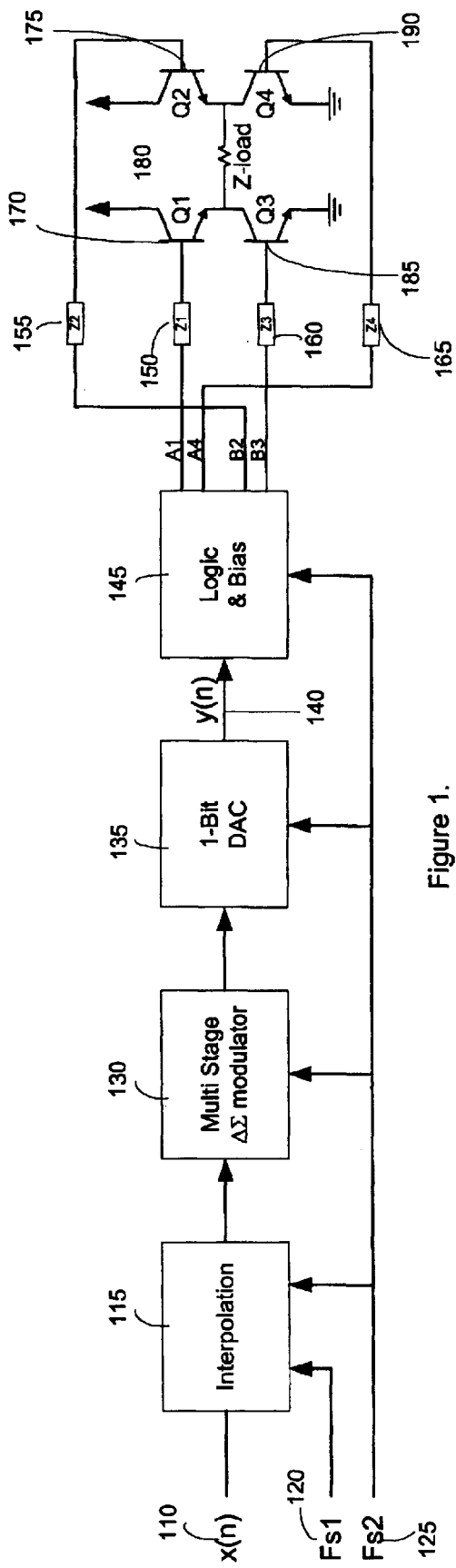
FIG. 1 is a block diagram of a high-current digital-to-analog-converter (DAC) according to an embodiment of the present invention.

In one embodiment and in reference to FIG. 1, a digital sequence x(n) 110, clocked at an input sampling rate of FS1 120 is applied to an interpolator 115, where it is sampled at a rate of FS2 125, where the ratio of FS2 and FS1 is known as the oversampling rate (OSR)(i.e., FS2=FS1*OSR). The sequence x(n) is then fed into a multi-stage delta-sigma (ΔΣ) modulator 130 where the sequence is once again sampled at the higher sampling rate of FS2 in order to get a bi-level output of the sequence as well as spectrally shaping the noise signal. Such spectral shaping of the noise signal insures that the noise power is small in the signal band. The bi-level output of the multi-stage ΔΣ modulator 130, which is a logic value, is applied to the a 1-bit digital-to-analog converter 135, where the sampling is once again at the rate of FS2. The 1-bit digital-to-analog converter 135 converts the bi-level logic value to an analog waveform of one being high and another being low (i.e., a one or a zero). The output y(n) 140 of 1-bit DAC 135 is a two-level or binary sequence at clock rate FS2. Y(n) is applied to the a logic & bias block 145, clocked at a sampling rate of FS2, and is implemented as a synchronous state machine where the signal is converted into appropriate drive signals for the output transistors labeled 170, 175, 185 and 190 with input impedances 150, 155, 160 and 165.

Figure 2:
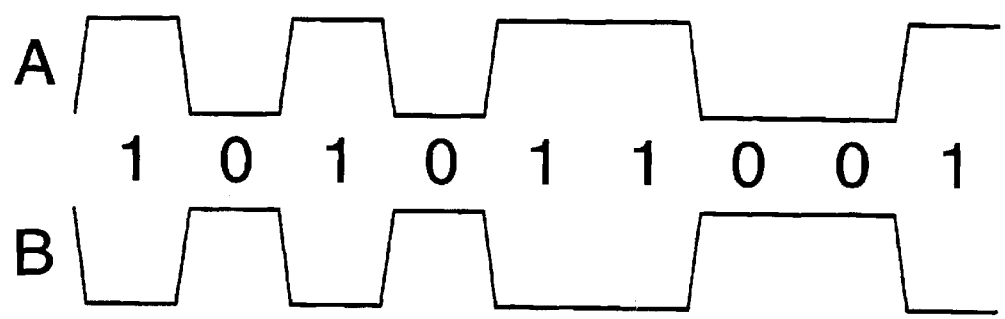
FIG. 2 is a drive wave-form diagram according to an embodiment of the present invention.

In one embodiment of the present invention and in reference to FIG. 2, when the output sequence y(n) 140, from the 1-bit digital-to-analog converter 135 is a high signal (e.g., a "1"), it drives pulse A in FIG. 2 high and pulse B low, which causes transistors 170 and 190 to be "ON" and transistors 175 and 185 to be "OFF"; similarly, when y(n) is a low signal, it drives pulse B in FIG. 2 high and pulse A low, which causes transistors 175 and 185 to be "ON" and transistors 170 and 190 to be "OFF."

Figure 3:
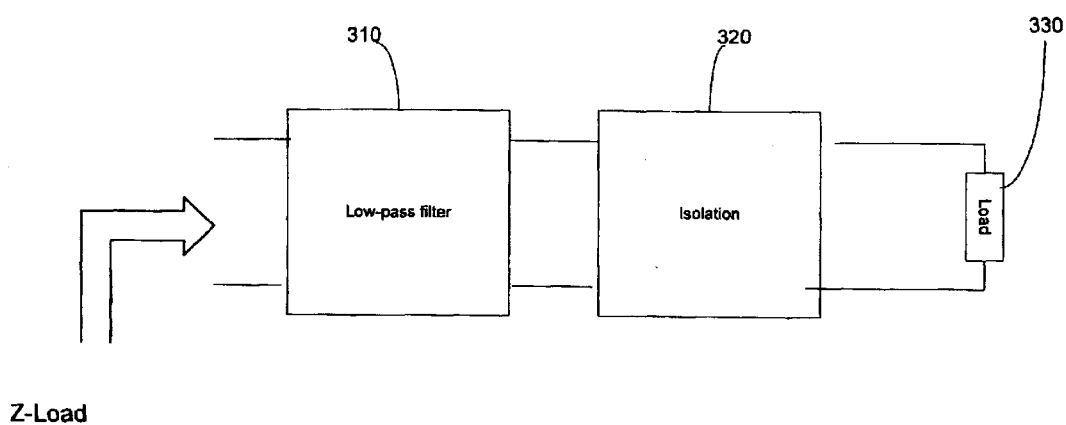
FIG. 3 is a block diagram illustrating a DSL driver load according to an embodiment of the present invention.

In one embodiment of the present invention and in reference to FIG. 1, transistors 185 and 190, may be eliminated altogether and the Z-load 180, be driven single ended, so as to reduce circuit complexity by the reduction of the output transistors from four to two. FIG. 3 is a block diagram illustrating a Z-load 180 according to embodiments of the invention. As shown, Z-load 180 may further comprise a low-pass filter 310, an isolation circuit 320, and a load 330. Other configurations may also be used.

In one other embodiment of the present invention and in reference to FIG. 1, the bi-level sequence y(n) 140, which can be only a high signal or a low signal becomes the input to the output transistors. Therefore, when y(n) is a high signal, the preceding pulse of the sequence y(n−1) is a low signal in which transistor 185 is turned "OFF" prior to transistor 190 being turned "ON" and transistor 175 is turned "OFF" prior to transistor 170 being turned "ON", a technique that insures that transistors 185 and 190 on one instance and transistors 175 and 170 are not "ON" simultaneously on another instance, in order to avoid excessive current drain from the power supply.

In another embodiment of the present invention and in reference to FIG. 1, the bi-level sequence y(n) 140, which can be only a high signal or a low signal which is the input to the output transistors. Therefore, when y(n) is a low signal, the preceding pulse of the sequence y(n−1) is a high signal, transistor 190 is turned "OFF" prior to transistor 185 being turned "ON" and transistor 170 is turned "OFF" prior to transistor 175 being turned "ON", a technique that insures that transistors 185 and 190 on one instance and transistors 175 and 170 are not "ON" simultaneously on another instance, in order to avoid excessive current drain from the power supply.

Figure 4:
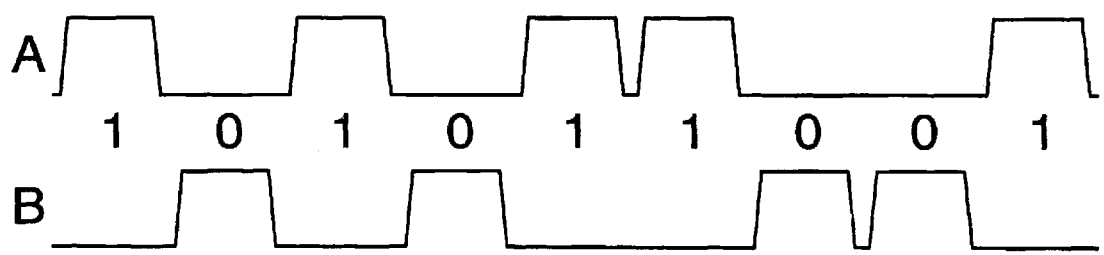
FIG. 4 is a drive wave-form diagram illustrating a return to zero in the digital domain according to an embodiment of the present invention.
Figure 5:
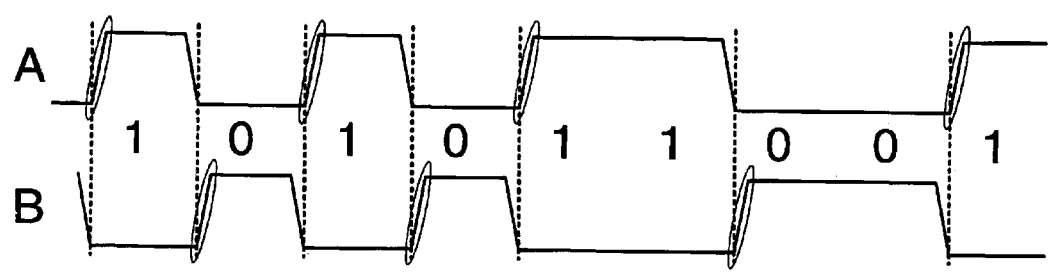
FIG. 5 is a drive wave-form diagram illustrating delay of a rising edge in the analog domain according to an embodiment of the present invention.

In another embodiment of the present invention, a method of turning "OFF" transistor 185 prior to turning "ON" transistor 190 and turning "OFF" transistor 175 prior to turning "ON" transistor 170 on occasion and turning "OFF" transistor 190 prior to turning "ON" transistor 185 and turning "OFF" transistor 170 prior to turning "ON" transistor 175 on another occasion can be digitally achieved via the logic & bias block 145, which may be implemented as a synchronous state machine clocked at a higher rate than FS2 125, in order to implement a return to zero drive waveform with a duty cycle of (m−1)/m or (m−2)/m, where m is integer value of the clock rate as shown in FIG. 4. The same implementation can be achieved in an analog fashion as shown in FIG. 5, where the rising edges of the waveform can be delayed in relation to the falling edges.

In another embodiment of the present invention, the transistors 170 and 190 are conducting while transistors 175 and 185 are off, alternately, 175 and 185 conduct while 170 and 190 are off. The high-current digital-to-analog converter can be simplified by eliminating transistors 185 and 190 leaving transistors 170 and 175, thereby, driving the load single-ended.

While the invention has been described in conjunction with the preferred embodiments, it should be understood that modifications will become apparent to those of ordinary skill in the art and that such modifications are intended to be included within the scope of the invention and the following claims.

What is claimed is:

1. A method for reducing power consumption in a DSL line driver, the method comprising:
  receiving a signal to be transmitted;
  sampling the signal at a first frequency;
  interpolating the signal by oversampling the signal at a second frequency to form an oversampled signal;
  modulating the oversampled signal with a delta-sigma modulator to produce a bi-level sequence output;
  converting the bi-level sequence output into an analog waveform; and
  coupling the analog waveform to four output transistors and wherein only two of the four output transistors are conducting at one time.

2. The method of claim 1, wherein the first frequency is an input sampling rate.

3. The method of claim 1, wherein second frequency is a DSL line driver pulse sampling rate.

4. The method of claim 1, wherein second sampling rate is higher than the first sampling rate.

5. The method of claim 1, wherein the ratio of the second sampling rate and the first sampling rate is an oversampling rate.

6. A method for reducing power consumption in a DSL line driver, the method comprising:
receiving a signal to be transmitted;
sampling the signal at a first frequency;
interpolating the signal by oversampling the signal at a second frequency to form an oversampled signal;
modulating the oversampled signal with a delta-sigma modulator to produce a bi-level sequence output;
converting the bi-level sequence output into an analog waveform; and
coupling the analog waveform to an output transistor further comprises coupling to two output transistors.

7. The method of claim 6, wherein one of the two output transistors is switched off prior to the other of the two output transistors being turned on.

8. The method of claim 7, wherein the step of switching off one of the two output transistors prior to turning on the other of the two output transistors further comprises implementing a return to zero waveform.

9. The method of claim 8, wherein the return to zero waveform has a duty cycle of $(m-1)/m$ or $(m-2)/m$.

10. The method of claim 9, wherein m is an integer.

11. The method of claim 7, wherein the step of switching off one of the two output transistors prior to turning on the other of the two output transistors is implemented in an analog step by delaying a rising edge with respect to the falling edge of an analog waveform.

12. A method for reducing cower consumption in a DSL line driver, the method comprising:
receiving a signal to be transmitted;
sampling the signal at a first frequency;
interpolating the signal by oversampling the signal at a second frequency to form an oversampled signal;
modulating the oversampled signal with a delta-sigma modulator to produce a bi-level sequence output;
converting the bi-level sequence output into an analog waveform; and
coupling the analog waveform to an output transistor wherein coupling the analog waveform to an output transistor is achieved by a logic and bias circuit.

13. The method of claim 12, wherein the analog waveform comprises pulses with a value of one of high pulse and one of a low pulse.

14. The method of claim 13, wherein one pulse of the sequence analog waveform is represented by y(n), and a preceding pulse is represented by y(n−1).

15. The method of claim 14, wherein y(n) is a high signal, and y(n−1) is a low signal.

16. The method of claim 14, wherein y(n) is a low signal, and y(n−1) is a high signal.

17. An apparatus for reducing power consumption in a DSL line driver, comprising:
a receiver for receiving a digital signal to be transmitted;
a signal sample for sampling the signal at a first frequency;
an interpolator for interpolating the signal by oversampling the signal at a second frequency to form an oversampled signal;
a modulator for modulating the oversampled signal with a delta-sigma modulator to produce a bi-level sequence output and to perform noise-shaping;
a converter for converting the bi-level sequence output into an analog waveform; and
a coupler for coupling the analog waveform to four output transistors and wherein two of the four transistors are conducting at one time while the other two of the four transistors are off.

18. The apparatus of claim 17, wherein the first frequency is an input sampling rate.

19. The apparatus of claim 17, wherein second frequency is a line driver pulse sampling rate.

20. The apparatus of claim 17, wherein second sampling rate is higher than the first sampling rate.

21. The apparatus of claim 17, wherein the ratio of second sampling rate and the first sampling rate is an oversampling rate.

22. An apparatus for reducing power consumption in a DSL line driver, comprising:
a receiver for receiving a digital signal to be transmitted;
a signal sample for sampling the signal at a first frequency;
an interpolator for interpolating the signal by oversampling the signal at a second frequency to form an oversampled signal;
a modulator for modulating the oversampled signal with a delta-sigma modulator to produce a bi-level sequence output and to perform noise-shaping;
a converter for converting the bi-level sequence output into an analog waveform; and
a coupler for coupling the analog waveform to two output transistors.

23. The apparatus of claim 22, wherein one of the two output transistors is switched off prior to the other of the two output transistors being turned on.

24. The apparatus of claim 23, wherein the step of switching off one of the two output transistors prior to turning on the other of the two output transistors is digitally implemented by a return to zero waveform.

25. The apparatus of claim 24, wherein the return to zero waveform has a duty cycle of $(m-1)/m$ or $(m-2)/m$.

26. The apparatus of claim 25, wherein m is an integer.

27. The apparatus of claim 23, wherein the switching off one of the two output transistors prior to turning on the other of the two output transistors is implemented in an analog step by delaying a rising edge with respect to the falling edge of an analog waveform.

* * * * *